United States Patent [19]

Zalessky et al.

[11] 4,286,220

[45] Aug. 25, 1981

[54] METHOD AND DEVICE FOR DISCRIMINATING DIFFERENCE FREQUENCY OF TWO PULSE TRAINS

[76] Inventors: Eduard A. Zalessky, ulitsa Tashkentskaya, 130, kv. 11; Vladimir V. Smyshlyaev, ulitsa Michurina, 116 kv. 57, both of Kuibyshev, U.S.S.R.

[21] Appl. No.: 7,511

[22] Filed: Jan. 29, 1979

[30] Foreign Application Priority Data

Feb. 10, 1978 [SU] U.S.S.R. ................................ 2578262
Feb. 10, 1978 [SU] U.S.S.R. ................................ 2600021

[51] Int. Cl.³ .............................................. H03K 5/26
[52] U.S. Cl. ..................................... 328/133; 307/525
[58] Field of Search ....................... 328/133, 134, 151; 307/232, 233

[56] References Cited

U.S. PATENT DOCUMENTS

| | | | |
|---|---|---|---|
| 3,526,841 | 9/1970 | Holmboe et al. ..................... | 328/133 |
| 3,588,710 | 6/1971 | Masters ................................. | 328/133 |
| 3,961,203 | 6/1976 | Hutch .............................. | 307/232 X |

*Primary Examiner*—John S. Heyman
*Attorney, Agent, or Firm*—Steinberg & Raskin

[57] ABSTRACT

In a method for discriminating the frequency difference of two pulse trains, the pulses of one train are separated into odd and even pulses, while in the second train every second pulse is separated. Then, every second pulse is checked for coincidence with even or odd pulses and, once such a coincidence occurs, the next check is for coincidence with, respectively, odd or even pulses, the frequency of such coincidences being representative of the frequency difference. In a device for discriminating the frequency difference of two pulse trains, a circuit for comparing one train with the other includes a separator of even and odd pulses, whose input serves as one of the inputs of the device. The circuit also includes two AND gates having their first inputs connected to the outputs of the separator, an OR gate having its inputs coupled to the outputs of the two AND gates, an additional AND gate whose output serves as an output of the device and whose first input is connected to the OR gate, a two-to-one pulse frequency divider whose input serves as the other input of the device and whose output is connected to the second input of the AND gate, and a flip-flop connected to the output of the additional AND gate and having its outputs connected to the second inputs of the first two AND gates, the outputs of the flip-flop serving as the other outputs of the device.

2 Claims, 8 Drawing Figures

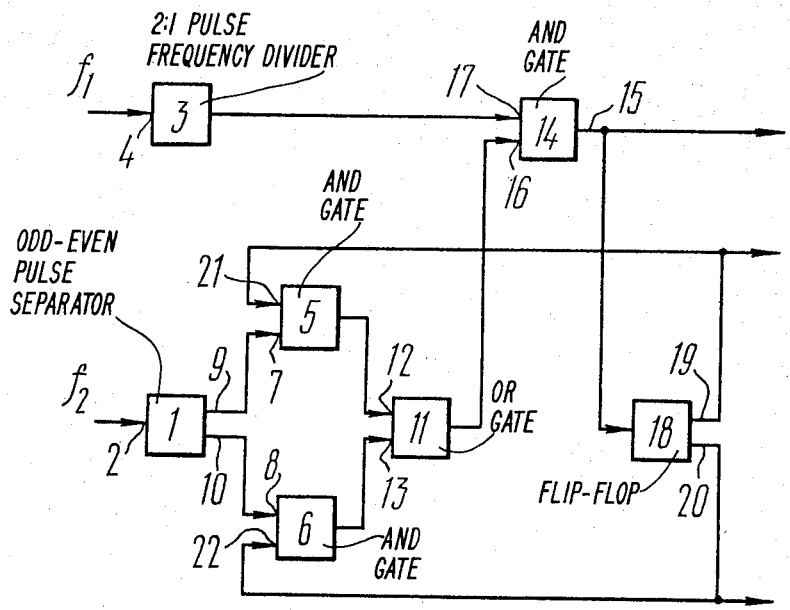
FIG. 1
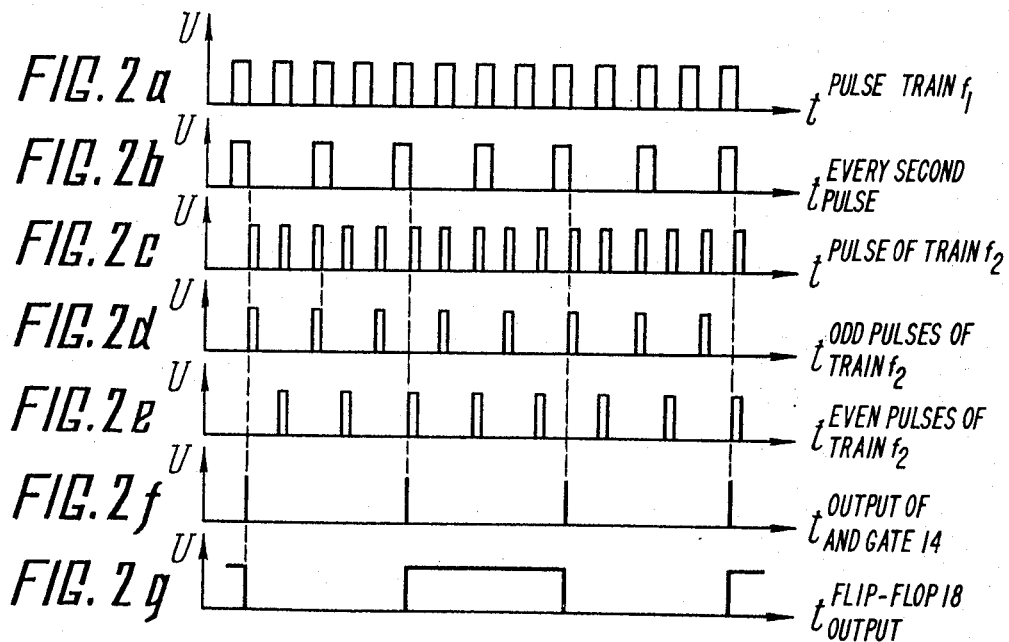

METHOD AND DEVICE FOR DISCRIMINATING DIFFERENCE FREQUENCY OF TWO PULSE TRAINS

FIELD OF THE INVENTION

The present invention relates to ultrasonic measurements, and more particularly to methods and devices for discriminating the frequency difference of two pulse trains.

The invention is applicable in various radiotechnical devices. It can most advantageously be used in ultrasonic pulse-frequency flow meters, for discriminating the small difference in the frequencies of two pulse trains.

BACKGROUND OF THE INVENTION

The higher accuracy of flow measurements with the aid of ultrasonic flow meters have imposed more stringent requirements on the resolution and data reliability of the frequency mixers used as output units in flow meters.

In a known method for mixing frequencies, a determination is made of the time intervals between pulses belonging to different pulse trains, which periodically vary in a linear manner from zero to a maximum value. These intervals are representative of the frequency difference period, hence of the frequency difference of two pulse trains.

This method is carried out by a prior art device comprising a flip-flop and a sawtooth voltage generator which incorporates a capacitor and a discharger (cf. N. I. Brazhnikov, Ultrasonic Techniques, Energiya Publishers, Moscow-Leningrad, 1965, pp. 167–169/in Russian/).

When the inputs of the flip-flop receive pulses of two trains, derived at its output are pulses whose width equals the time intervals between pulses from both trains. These pulses charge the capacitor to a threshold value, which is then discharged with the aid of the discharger. The frequency of the sawtooth voltages is representative of the frequency difference of two train pulses.

In the prior art device, however, the frequency difference determination may be erroneous due, in the case of a small frequency difference, to the phase instability of the pulse trains relative to each other. In addition, to ensure normal operation of the device, the trains of pulses applied to its inputs must be separated in time, which results in erroneous readings of real flow meters.

Another method for mixing frequencies provides discrimination of the frequency difference of pulse trains in the form of meandering shapes. Discriminated in accordance with this method is a frequency difference occurring as a result of a gradual change in the phase shift, the discrimination consisting in registering the presence of a pulse of one train at the moment of arrival of a pulse of the second train.

The prior art device for realizing this method comprises a clocked dynamic flip-flop, with the compared pulse trains being applied, respectively, to the data and clock inputs of the flip-flop, while frequency difference signals are derived at its output (cf. V. S. Gutnikov, Integrated Electronics in Measuring Instruments, Energiya Publishers, Leningrad, 1974, pp. 115–117, FIG. 62a/in Russian/).

The area of application of this method is limited by the shape of the pulses in the trains since it is applicable only to pulses of a meander shape. In this case, too, the readings obtained on the prior art device may be erroneous.

In still another method for discriminating the frequency difference of two pulse trains, the numbers of pulses in each train are compared. The instant at which the difference in the pulse number reaches an integral value is registered. Starting from that instant, a corresponding integral number of pulses of the greater frequency are allowed to pass, thereby providing a measure of the frequency difference.

This method is carried out in a device comprising means for comparing two pulse trains. The comparison means is built around a two-bit reversible counter with AND gates (cf. V. S. Gutnikov, Integrated Electronics in Measuring Instruments, Energiya Publishers, Leningrad, 1974, pp. 115–117, FIG. 62b/in Russian/).

The counter compares the numbers of pulses in each train, having frequencies $f_1$ and $f_2$. Once the difference in the number of pulses reaches an integral value, one of the AND gates disables further comparison. Therewith, the corresponding integral number of subsequent pulses of the greater frequency pass to the output of the device. Should the pulses of frequencies $f_1$ and $f_2$ coincide, the reversible counter may not operate properly, and the indication of the device will be false.

Since, when comparing two pulse trains, there always comes an instant at which pulses coincide, and that is not tolerable in the prior art method for discriminating the frequency difference of two pulse trains, the area of application of this method is very limited.

The means for comparing two pulse trains, built around a reversible counter with logic AND gates, functions normally only when the pulses applied to the input of the device are separated in time. A coincidence of pulses makes it inoperable, which results in erroneous information and improper operation of the device as a whole.

SUMMARY OF THE INVENTION

It is an object of the present invention to provide a method for discriminating the frequency difference of two pulse trains, which will provide for reliable information when the frequencies are mixed.

Another object of the invention is to improve the resolution of the frequency difference discrimination.

Still another object of the invention is to provide a device for discriminating the frequency difference of two pulse trains, which device is simple in design and reliable in operation.

These objects are attained by a method for discriminating the frequency difference of two pulse trains by comparing one pulse train with the other, according to the invention. In the method of the invention, the comparison is carried out in such a manner that the pulses of one train are separated into odd and even pulses, while in the second train every second pulse is separated. Then, every second pulse is checked for coincidence with even or odd pulses and, once such a coincidence occurs, the next check is for coincidence with, respectively, odd or even pulses, the frequency of the coincidences being representative of the frequency difference.

The objects of the present invention are also achieved by a device for discriminating the frequency difference of two pulse trains by the aforedescribed method. The device of the invention comprises a circuit for comparing one pulse train with the other. In accordance with the invention, the comparison circuit includes a separator of even and odd pulses, whose input serves as an input of the device, two AND gates whose first inputs are connected to the outputs of the separator, an OR gate having its inputs connected to the outputs of the two AND gates, an additional AND gate whose output serves as an output of the device and whose one input is connected to the OR gate, a two-to-one pulse frequency divider whose input serves as the other input of the device and whose output is connected to the other input of the AND gate, and a flip-flop connected to the output of the additional AND gate, having its outputs connected to the second inputs of the first two AND gates and serving as the other outputs of the device.

The proposed method and device for discriminating the frequency difference of two pulse trains preclude errors in the output information in the case of a coincidence of pulses and phase instability of the pulse trains and provides for a better resolution of the frequency difference discrimination. This, in turn, provides for a higher accuracy of measurement by instruments, particularly ultrasonic pulse-frequency flow meters, in which the proposed method and device are implemented.

BRIEF DESCRIPTION OF THE DRAWINGS

The invention will now be described in greater detail with reference to a specific embodiment thereof, taken in conjunction with the accompanying drawings, wherein:

FIG. 1 is a block diagram of an embodiment of the device of the invention for discriminating the frequency difference of two pulse trains by the method of the invention; and FIGS. 2 a, b, c, d, e, f, g are waveforms illustrating the operating principle of the device of FIG. 1.

DETAILED DESCRIPTION OF THE INVENTION

The device for discriminating the frequency difference of two pulse trains by the herein-proposed method comprises a circuit for comparing one pulse train with the other. The circuit includes a separator 1 (FIG. 1) of even and odd pulses, whose input serves as an input 2 of the device, and a two-to-one pulse frequency divider 3 the input of which serves as the other input 4 of the device. The comparison circuit also includes two AND gates 5 and 6 having their first inputs 7 and 8 connected, respectively, to outputs 9 and 10 of the separator 1, and an OR gate 11 whose inputs 12 and 13 are coupled to the outputs of said two AND gates 5 and 6. The comparison circuit further includes an additional AND gate 14, the output of which serves as an output 15 of the device. An input 16 of the AND gate 14 is connected to the OR gate 11, and the other input 17 is coupled to the divider 3. A flip-flop 18 connected to the output of the additional AND gate 14 and has its outputs 19 and 20 connected to the second inputs 21 and 22, respectively, of the first two AND gates 5 and 6. The outputs 19 and 20 of the flip-flop 18 serve as the other outputs 19 and 20 of the device. Used as the separator 1 of even and odd pulses and the frequency divider 3 are flip-flops, although use may also be made of blocking oscillators and other radiotechnical devices.

The method of the invention for discriminating the frequency difference of two pulse trains comprises applying a pulse train having a frequency $f_1$ to the input 4 of FIG. 1, while another train of pulses at a frequency $f_2$ is applied to the input 2.

Every second pulse (FIG. 2b) is separated from the pulse train $f_1$ (FIG. 2a) with the aid of the divider 3.

The pulses in the train $f_2$ (FIG. 2c) are divided by the separator 1 into odd pulses (FIG. 2d) and even pulses (FIG. 2e).

Depending on the state of the flip-flop 18, for example, when the output 19 of the flip-flop 18 is high, some of the pulses, e.g. odd ones, are applied from the output 9 of the separator 1 to the input 7 of the AND gate 5. Since the input 21 of the AND gate 5 is high, the odd pulses pass via the AND gate 5 to the input 12 of the OR gate 11 and further to the input 16 of the AND gate 14. In the AND gate 14, every second pulse separated by the divider 3 and applied to the input 17 of said AND gate is checked for coincidence with odd pulses.

After a coincidence occurs, the pulse from the output 15 of the AND gate 14 (FIG. 2f) switches the flip-flop 18 into the opposite state (FIG. 2g). Therewith, the output 20 of the flip-flop 18 is high and the AND gate 6 opens at the input 22, while the AND gate 5 is blocked at the input 21. In this case, the even pulses from the output 10 of the separator 1 are applied to the input 8 of the AND gate 6 and from its output proceed to the input 13 of the OR gate 11 and further to the input 16 of the AND gate 14.

Thus, after a pulse coincidence has been registered, one of the compared pulse trains is shifted by a half-cycle, which by far exceeds the phase instability of the pulses.

The frequency of coincidences of every second pulse with odd and even pulses at the output 15 of the AND gate 14 is a modulus of the frequency difference $(f_1 - f_2)$ (FIG. 2f), and pulses of a meander shape appear at the outputs 19 and 20 of the flip-flop 18 at a frequency $(f_1 - f_2/2)$ (FIG. 2g).

In a pulse-frequency flow meter where the present invention can be used, the difference in the frequencies of two pulse trains, which is a measure of flow, is small. In this case, the following condition is met:

$$T_{max} - T_{min} < \tau_{max} + \tau_{min} < T_{max} - T_{min}/2,$$

wherein $T_{max}$, $T_{min}$ are the maximum and minimum periods of the pulse trains and $\tau_{max}$, $\tau_{min}$ are the widths of the pulses in the trains of the maximum and minimum periods.

This condition permits one of the compared pulse trains to be periodically shifted by a half-cycle.

The method and device of the invention enable determination of the difference in the frequencies of two pulse trains, which are very close in value, without any errors in the output data due to the phase instability of the pulse trains relative to each other, which is most essential in ultrasonic flow meters.

What is claimed is:

1. A method of determining the frequency difference of two pulse trains, said method comprising the steps of
    separating the pulses of one pulse train into odd and even pulses;
    separating every second pulse in another pulse train;
    checking every second pulse of said other pulse train for coincidence with the even pulses of said one pulse train;
    checking, after said coincidence, every second pulse of said other pulse train for coincidence with the odd pulses of said one pulse train;
    discriminating the sequence of said coincidences; and determining the frequency of the discriminated sequence of coincidence, which is the frequency difference of said pulse trains.

2. A device for determining the frequency difference of first and second pulse trains, said device comprising
- a separator of odd and even pulses, said separator having an input which functions as a first input of said device and first and second outputs, a first pulse train being applied to said input;
- a first AND gate having a first input electrically connected to the first output of said separator, a second input and an output;
- a second AND gate having a first input electrically connected to the second output of said separator, a second input and an output;
- an OR gate having a first input electrically connected to the output of said first AND gate, a second input electrically connected to the output of said second AND gate and an output;
- a third AND gate having a first input, a second input electrically connected to the output of said OR gate and an output which functions as a first output of said device;
- a 2:1 pulse frequency divider having an input which functions as a second input of said device and an output electrically connected to the first input of said third AND gate, a second pulse train being applied to said input, the output of said third AND gate providing a signal of the frequency difference of said first and second pulse trains; and
- a flip-flop having an input electrically connected to the output of said third AND gate, a first output electrically connected to the second input of said first AND gate, said first output functioning as a second output of said device, and a second output electrically connected to the second input of said second AND gate, said second output functioning as a third output of said device.

* * * * *